United States Patent
Tomizawa et al.

(10) Patent No.: US 9,799,595 B2
(45) Date of Patent: Oct. 24, 2017

(54) CARELESS WIRING SUBSTRATE HAVING AN INSULATION LAYER WITH A BULGED COVERING PORTION AND SEMICONDUCTOR DEVICE THEREOF

(71) Applicant: SHINKO ELECTRIC INDUSTRIES CO., LTD., Nagano-Ken (JP)

(72) Inventors: Hiroshi Tomizawa, Nagano (JP); Katsuya Fukase, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 15/297,782

(22) Filed: Oct. 19, 2016

(65) Prior Publication Data
US 2017/0125333 A1 May 4, 2017

(30) Foreign Application Priority Data
Oct. 28, 2015 (JP) ................. 2015-211723

(51) Int. Cl.
*H01L 23/498* (2006.01)
*H05K 1/18* (2006.01)
*H01L 23/31* (2006.01)
*H01L 23/00* (2006.01)

(52) U.S. Cl.
CPC .... *H01L 23/49838* (2013.01); *H01L 23/3128* (2013.01); *H01L 23/49816* (2013.01); *H01L 23/49822* (2013.01); *H01L 23/49827* (2013.01); *H01L 24/09* (2013.01)

(58) Field of Classification Search
CPC ......... H01L 23/49861; H01L 23/49866; H01L 23/49833; H01L 23/4985; H01L 21/568; H05K 1/185; H05K 1/182
See application file for complete search history.

(56) References Cited

U.S. PATENT DOCUMENTS

| | | | | |
|---|---|---|---|---|
| 8,487,192 B2* | 7/2013 | Kunieda | ............. | H01L 21/6835 174/255 |
| 8,923,008 B2* | 12/2014 | Yoshikawa | ............ | H05K 1/188 174/257 |
| 2011/0139498 A1* | 6/2011 | Kunieda | ............. | H01L 21/6835 174/257 |

FOREIGN PATENT DOCUMENTS

JP   2011-124555 A   6/2011

* cited by examiner

*Primary Examiner* — Andrew Q Tran
(74) *Attorney, Agent, or Firm* — Tarolli, Sundheim, Covell & Tummino LLP

(57) ABSTRACT

A wiring substrate is provided with a wiring pattern including a pad and a circuit pattern. The pad is formed in a mounting region where an electronic component is mounted, and the circuit pattern extends in a planar direction from the pad. An insulation layer covers a lower surface of the wiring pattern and a side surface of the wiring pattern and partially exposes an upper surface of the wiring pattern. The insulation layer includes a covering portion that continuously covers an entire peripheral portion of the upper surface of the wiring pattern. The insulation layer includes an upper surface located upward from the upper surface of the wiring pattern.

7 Claims, 11 Drawing Sheets

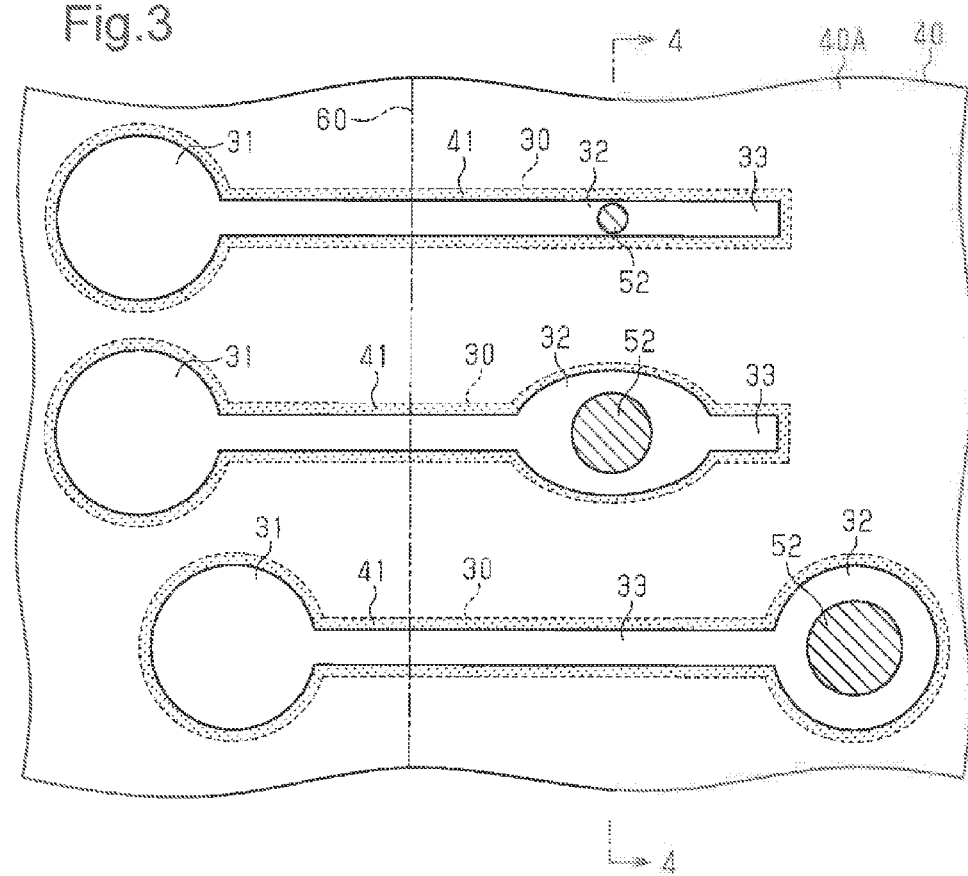
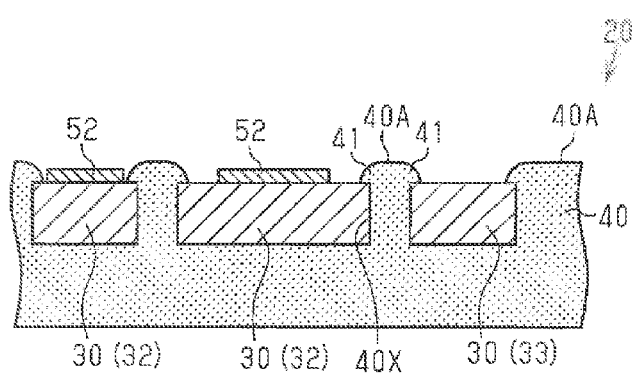

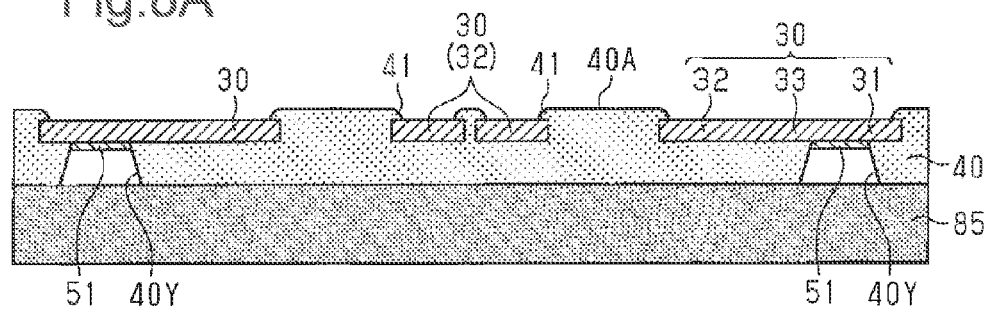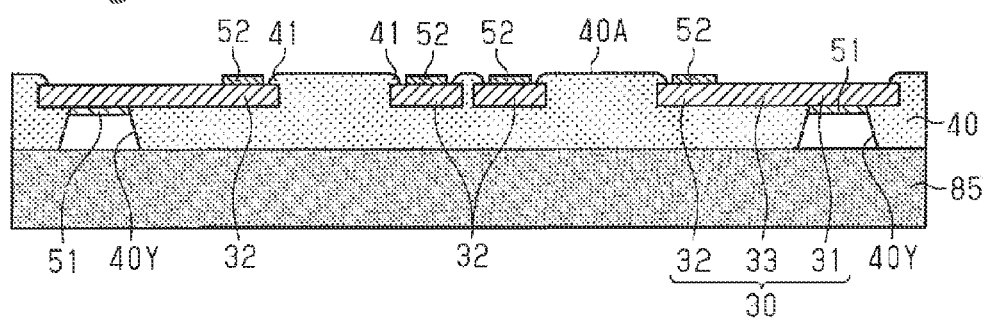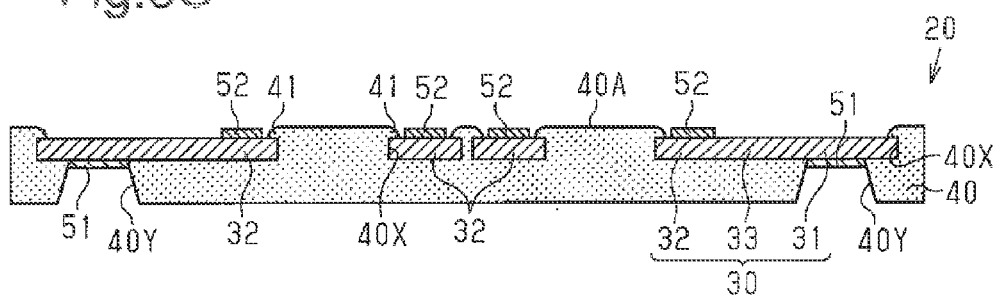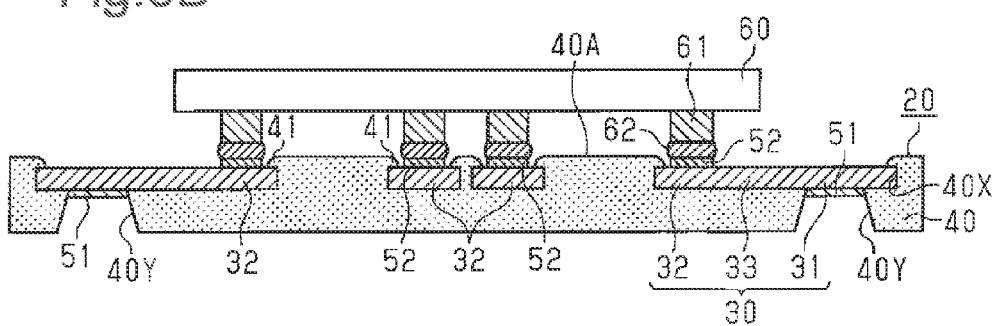

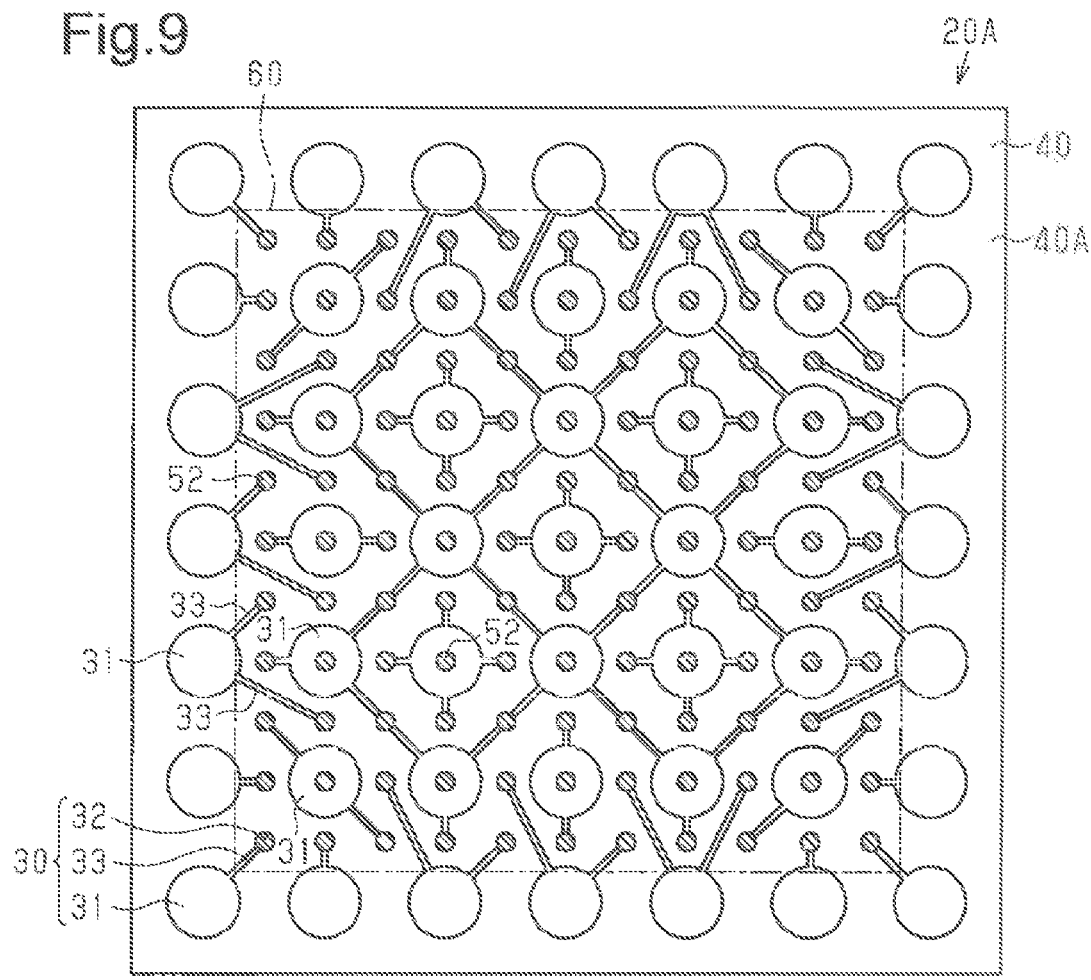

CARELESS WIRING SUBSTRATE HAVING AN INSULATION LAYER WITH A BULGED COVERING PORTION AND SEMICONDUCTOR DEVICE THEREOF

CROSS-REFERENCE TO RELATED APPLICATIONS

This application is based upon and claims the benefit of priority from prior Japanese Patent Application No. 2015-211723, filed on Oct. 28, 2015, the entire contents of which are incorporated herein by reference.

FIELD

This disclosure relates to a wiring substrate, a semiconductor device, and a method for manufacturing a wiring substrate.

BACKGROUND

The increase in the number of semiconductor elements on wiring substrates has resulted in a demand for wiring substrates with reduced thickness and an increased number of wiring patterns. To meet such demands, a coreless wiring substrate has been developed. The coreless wiring substrate does not include a core substrate (support member) which has high rigidity and is thicker than an interlayer insulation layer. Japanese Laid-Open Patent Publication No. 2011-124555 describes such a coreless wiring substrate.

A basic method for manufacturing a coreless wiring substrate will now be described. A provisional substrate is first prepared as a support substrate. Then, a wiring pattern including pads is formed on the provisional substrate. A given number of build-up wiring layers and insulations layers are stacked on the provisional substrate. Finally, the provisional substrate is removed.

In a wiring substrate that is manufactured through the method described above, the wiring patterns that include pads are formed on the same plane as the outermost insulation layer. In other words, the upper surface of each wiring pattern is flush with (i.e., located on the same level as) the upper surface of the outermost insulation layer. In such a wiring substrate, the wiring patterns easily delaminate from the insulation layer.

SUMMARY

One embodiment of a wiring substrate includes a wiring substrate including a wiring pattern and an insulation layer. The wiring pattern includes a pad and a circuit pattern. The pad is formed in a mounting region where an electronic component is mounted, and the circuit pattern extends in a planar direction from the pad. The insulation layer covers a lower surface of the wiring pattern and a side surface of the wiring pattern and partially exposes an upper surface of the wiring pattern. The insulation layer includes a covering portion that continuously covers an entire peripheral portion of the upper surface of the wiring pattern. The insulation layer includes an upper surface located upward from the upper surface of the wiring pattern.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 3 is a partial, enlarged plan view illustrating the wiring substrate of FIG. 1;

FIG. 4 is a cross-sectional view taken along line 4-4 in FIG. 3;

FIGS. 5A to 5D, 6A to 6D, 7A to 7C, and 8A to 8C are schematic cross-sectional views illustrating a method for manufacturing the wiring substrate of FIG. 1, in which FIG. 5D is a partial, enlarged cross-sectional view of FIG. 5C, and FIG. 6B is a partial, enlarged cross-sectional view of FIG. 6A;

FIG. 8D is a schematic cross-sectional view illustrating a method for manufacturing the semiconductor device of FIG. 2;

FIG. 9 is a schematic plan view illustrating a second embodiment of a wiring substrate;

DESCRIPTION OF THE EMBODIMENTS

Figure 1:
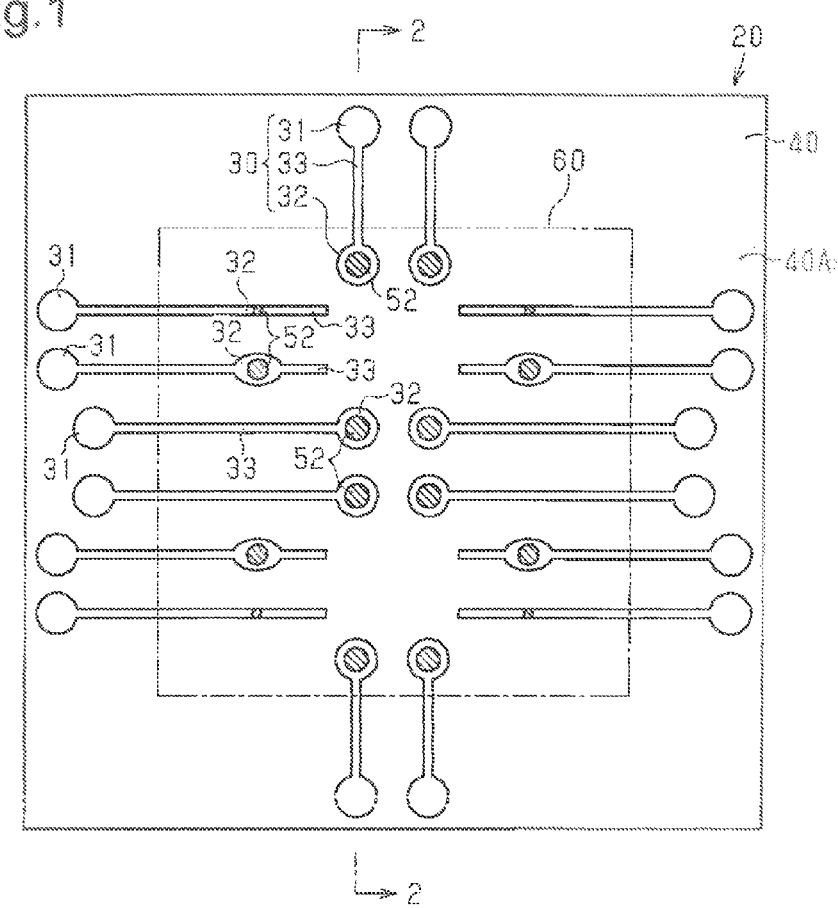
FIG. 1 is a schematic plan view illustrating a first embodiment of a wiring substrate.

Embodiments will now be described with reference to the drawings. In the drawings, elements are illustrated for simplicity and clarity and have not necessarily been drawn to scale. To facilitate understanding, hatching lines may not be shown or be replaced by shadings in the cross-sectional drawings.

First Embodiment

A first embodiment will now be described with reference to FIGS. 1 to 8D.

Figure 2:
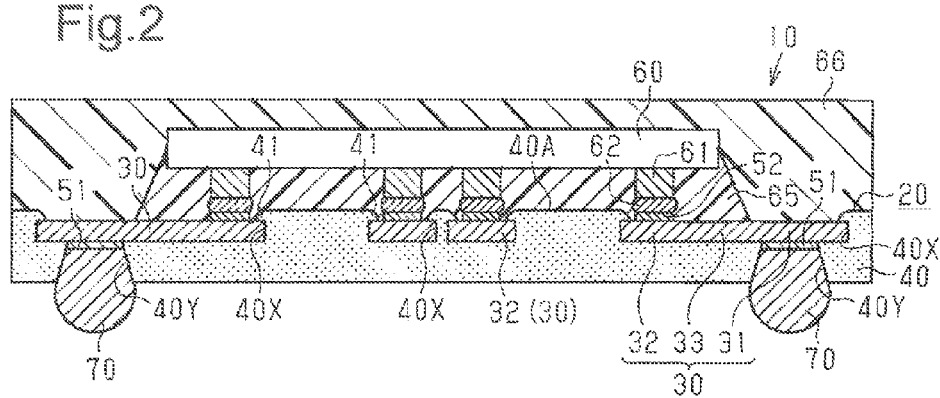
FIG. 2 is a schematic cross-sectional view illustrating a semiconductor device including the wiring substrate of FIG. 1 taken along line 2-2 in FIG. 1.

As illustrated in FIG. 2, a semiconductor device 10 includes a wiring substrate 20, a semiconductor element 60 that is flip-chip mounted on the wiring substrate 20, an underfill 65, an encapsulation resin 66, and external connection terminals 70. One or more semiconductor elements 60 may be flip-chip mounted on the wiring substrate 20. In the present example, there is only one semiconductor element 60.

The wiring substrate 20 includes wiring patterns 30, an insulation layer 40, and surface-processed layers 51 and 52. The wiring pattern 30 may be formed from, for example, copper (Cu) or a copper alloy. The insulation layer 40 may be formed from, for example, an insulative resin, such as an epoxy resin or a polyimide resin, or a resin material obtained by mixing such an insulative resin with a filler, such as silica or alumina.

Referring to FIG. 1, each wiring pattern 30 includes a connection pad 31, a pad 32, and a circuit pattern 33. The connection pad 31 is located outside a mounting region where the semiconductor element 60 is mounted. The pad 32 is located inside the mounting region. The circuit pattern 33 connects the connection pad 31 and the pad 32. The connection pad 31, the pad 32, and the circuit pattern 33 are formed integrally with one another.

The connection pads 31 of the wiring patterns 30 are located in a peripheral region of the wiring substrate 20. The connection pads 31 are arranged, for example, in a peripheral manner along the periphery of the wiring substrate 20. For example, the connection pads 31 are arranged surrounding the mounting region. Each connection pad 31 is, for example, circular in a plan view. Each connection pad 31 includes a lower surface that functions as an external connection pad connected to one of the external connection terminals 70 (refer to FIG. 2), such as a lead pin or a solder ball, used when mounted on a mounting substrate such as a motherboard.

As illustrated in FIG. 1, each circuit pattern 33 is, for example, rectangular in a plan view. Each circuit pattern 33 is laid out in a planar direction (direction orthogonal to thickness-wise direction of insulation layer 40 in a plan view). Each wiring pattern 30 serves as a first wiring pattern or a second wiring pattern. In the first wiring pattern 30, the circuit pattern 33 extends in the planar direction from the connection pad 31 toward the mounting region. The circuit pattern 33 includes a distal end where the pad 32 is formed. In other words, in the first wiring pattern 30, the connection pad 31 is formed on one end of the circuit pattern 33, and the pad 32 is formed on the other end of the circuit pattern 33. The pad 32 of the first wiring pattern 30 is, for example, circular in a plan view. In the second wiring pattern 30, the circuit pattern 33 extends in the planar direction from the connection pad 31 toward the mounting region, and the pad 32 is formed at an intermediate portion of the circuit pattern 33 in the extension direction of the circuit pattern 33. Accordingly, the circuit pattern 33 of the second wiring pattern 30 extends from the pad 32 further into the mounting region. The pad 32 of the second wiring pattern 30 is, for example, ellipsoidal or rectangular in a plan view. Each pad 32 includes an upper surface that functions as a semiconductor element mounting pad electrically connected to the semiconductor element 60. The pads 32 are laid out in the mounting region in accordance with the layout of connection terminals 61 (refer to FIG. 2) of the semiconductor element 60.

As illustrated in FIG. 2, the insulation layer 40 covers the side surfaces and lower surface of each wiring pattern 30 (connection pad 31, pad 32, and circuit pattern 33) and partially exposes the upper surface of each wiring patterns 30. In the present example, the insulation layer 40 covers the peripheral portion of the upper surface of each wiring pattern 30. Thus, the insulation layer 40 supports the wiring pattern 30.

The insulation layer 40 includes an upper portion projected further toward the upper side from the upper surfaces of the wiring patterns 30. Thus, the insulation layer 40 includes an upper surface 40A located upward from the upper surfaces of the wiring patterns 30. This forms a step between the upper portion of the insulation layer 40 and the upper surface of each wiring pattern 30.

The insulation layer 40 includes recesses 40X. Each recess 40X receives a corresponding one of the wiring patterns 30 so as to partially expose the upper surface of the corresponding wiring pattern 30. The recess 40X has a depth that corresponds to the distance from the upper surface 40A of the insulation layer 40 to an intermediate position of the insulation layer 40 in the thickness-wise direction. The depth of the recess 40X is greater than the thickness of the wiring pattern 30. The recess 40X is shaped in conformance with the wiring pattern 30 in a plan view.

Each wiring pattern 30 is located on the bottom surface of the corresponding recess 40X. Thus, the lower surface of the wiring pattern 30 is in contact with and covered by the insulation layer 40 that defines the bottom surface of the recess 40X. Further, the entire side surfaces of the wiring pattern 30 are in contact with and covered by the insulation layer 40 that defines the wall surfaces of the recess 40X.

A covering portion 41 extends along the upper portion of each wall surface of the recess 40X. The covering portion 41 projects into the recess 40X to partially cover the upper surface of each wiring pattern 30. The covering portion 41 is located above the wiring pattern 30 at a position overlapping the upper surface of the wiring pattern 30 in a plan view. In the present example, the covering portion 41 contacts and covers the peripheral portion of the upper surface of the wiring pattern 30.

Referring to FIG. 3, the covering portion 41 of the insulation layer 40 (shaded portion in FIG. 3) continuously covers the entire peripheral portion of the upper surface of each wiring pattern 30 (i.e., connection pad 31, pad 32, and circuit pattern 33). Thus, in the upper surface of each wiring pattern 30, a region slightly smaller than the contour of the wiring pattern 30 (refer to broken lines in FIG. 3) is exposed from the insulation layer 40.

Referring to FIG. 4, the side surface (peripheral surface) of the covering portion 41 is, for example, curved and outwardly bulged in a cross-sectional view. In other words, the side surface of the covering portion 41 has an arcuate cross section and projects toward the inner side of each recess 40X (wiring pattern 30) from where the upper surface 40A overlaps the side surface of each wiring pattern 30 in a plan view. In the present example, the lower end of the side surface of the covering portion 41 is the part of the covering portion 41 located at the innermost position with respect to the recess 40X (wiring pattern 30). The covering portion 41 has, for example, a sectoral shape in a cross-sectional view. The covering portion 41 holds the wiring pattern 30.

The upper surface 40A of the insulation layer 40 is flat. The upper surface 40A of the insulation layer 40 is, for example, parallel to the upper surface of each wiring pattern 30.

As described above, in the wiring substrate 20, the insulation layer 40 is in contact with six surfaces of each wiring pattern 30, namely, the four side surfaces, the lower surface, and the upper surface of each wiring pattern 30. Thus, the insulation layer 40 surrounds each wiring pattern 30. In particular, the covering portion 41 of the insulation layer 40 that contacts the upper surface of each wiring pattern 30 holds each wiring pattern 30. In other words, each wiring pattern 30 extends into the insulation layer 40 so that the peripheral portion of the upper surface of each wiring pattern 30 is held by the covering portion 41 of the insulation layer 40. This limits delamination of the wiring pattern 30 from the insulation layer 40.

Referring to FIG. 2, through holes 40Y extend through the insulation layer 40 in the thickness-wise direction and partially expose the lower surfaces of the connection pads 31 in the wiring patterns 30. The through holes 40Y are in communication with the recesses 40X. In the present example, the insulation layer 40 entirely covers the lower surface of each wiring pattern 30 except for the exposed portion of the lower surface of the connection pad 31 exposed to the inside of the through hole 40Y.

The surface-processed layer 51 is formed, when necessary, on the lower surface of each connection pad 31 that is exposed to the inside of the through hole 40Y. Examples of the surface-processed layer 51 include a gold (Au) layer, a nickel (Ni) layer/Au layer (stack of metal layers in which Ni layer and Au layer are formed in this order), and a Ni layer/palladium (Pd) layer/Au layer (stack of metal layers in which Ni layer, Pd layer, and Au layer are formed in this order). The Au layer, Ni layer, and the Pd layer may be, for example, an electroless plating metal layer formed through electroless plating. The Au layer is a metal layer formed from Au or an Au alloy. The Ni layer is a metal layer formed from Ni or a Ni alloy. The Pd layer is a metal layer formed from Pd or a Pd alloy. Alternatively, the surface-processed layer 51 may be formed by performing an organic solderability preservative (OSP) on the lower surface of the connection pad 31. For example, when performing the OSP process, an organic film of an azole compound or an imidazole compound is formed as the surface-processed layer 51 on the lower surface of the connection pad 31. When the surface-processed layer 51 is formed on the lower surface of the connection pad 31, the surface-processed layer 51 functions as an external connection pad.

In the present example, each external connection terminal 70 is formed on the surface-processed layer 51. However, the connection pad 31 (or surface-processed layer 51 formed on connection pad 31), which is exposed in the through hole 40Y may be used as an external connection terminal.

The surface-processed layer 52 is formed, when necessary, on the upper surface of each pad 32 exposed from the insulation layer 40. Examples of the surface-processed layer 52 include metal layers such as an Au layer, a Ni layer/Au layer, and a Ni layer/Pd layer/Au layer and an organic film formed through an OSP process. When the surface-processed layer 52 is formed on the upper surface of the pad 32, the surface-processed layer 52 functions as a semiconductor element mounting pad.

The semiconductor element 60 is flip-chip-mounted on the wiring substrate 20. That is, each of connection terminals 61 on a circuit formation surface (here, lower surface) of the semiconductor element 60 is joined with the surface-processed layer 52 of the wiring substrate 20 by joining members 62. The connection terminals 61 and the joining members 62 electrically connect the semiconductor element 60 to the wiring patterns 30.

The semiconductor element 60 may be, for example, a logic chip such as a central processing unit (CPU) chip or a graphics processing unit (GPU) chip. Alternatively, the semiconductor element 60 may be, for example, a memory chip such as a dynamic random access memory (DRAM) chip, a static random access memory (SRAM), or a flash memory. Further, multiple semiconductor elements 60 combining a logic chip and a memory chip may be mounted on the wiring substrate 20.

Each connection terminal 61 may be, for example, a metal post. The connection terminal 61 is a columnar connection terminal downwardly extending from the circuit formation surface of the semiconductor element 60. In the present example, the connection terminal 61 is cylindrical. The connection terminal 61 may be formed from, for example, copper or a copper alloy. Instead of a metal post, for example, a metal bump such as a gold bump may be used as the connection terminal 61.

The joining members 62 join the surface-processed layer 52 and the connection terminals 61. The joining members 62 may be formed by, for example, a tin (Sn) layer or lead-free solder plating. The lead-free solder may be, for example, a Sn-silver (Ag), a Sn—Cu, or a Sn—Ag—Cu lead-free solder.

The gap between the wiring substrate 20 and the semiconductor element 60 is filled with the underfill 65. The underfill 65 may be formed from, for example, an insulative resin such as an epoxy resin.

The encapsulation resin 66 is arranged on the insulation layer 40 of the wiring substrate 20 to encapsulate the semiconductor element 60. The encapsulation resin 66 covers the upper surface 40A of the insulation layer 40, the surface of the underfill 65, and the upper surfaces of the wiring patterns 30 exposed from the underfill 65 and the insulation layer 40. The encapsulation resin 66 may be an insulative resin, such as an epoxy resin or a polyimide resin, or a resin material obtained by mixing such an insulative resin with a filler, such as silica or alumina. Further, the encapsulation resin 66 may be, for example, a mold resin.

Each external connection terminal 70 is formed on the surface-processed layer 51 of the wiring substrate 20. The external connection terminal 70 is used, for example, to electrically connect a pad of a mounting substrate such as a motherboard (not illustrated). The external connection terminal 70 may be, for example, a solder ball or a lead pin. In the present example, a solder ball is used as the external connection terminal 70.

A method for manufacturing the wiring substrate 20 will now be described. For the sake of brevity, those elements that ultimately become part of the wiring substrate 20 are given the same reference numerals as the elements that they finally become.

Figure 5A:
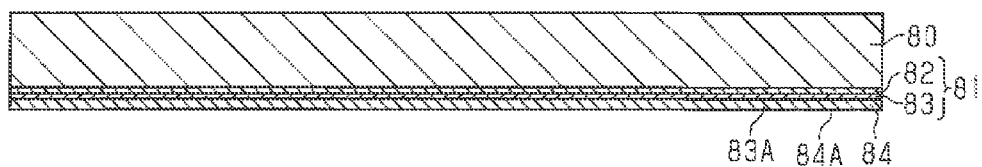

Referring to FIG. 5A, a support substrate is first prepared. The support substrate includes a support body 80 and a carrier-incorporated metal foil 81 applied to the lower surface of the support body 80. The support body 80 may be, for example, a prepeg obtained by impregnating reinforcement material, such as a woven cloth or non-woven cloth of glass, aramid, or liquid crystal polymer (LCP) fibers, with a thermosetting resin such as an epoxy resin or a polyimide resin. The carrier-incorporated metal foil 81 includes a carrier layer 82, which is applied to the lower surface of the support body 80, and an extremely thin metal foil 83, which is formed on the lower surface of the carrier layer 82 with a delamination layer located in between (not illustrated). The carrier layer 82 serves as a support material that facilitates handling of the metal foil 83. The carrier layer 82 is, for example, a copper plate having a thickness of approximately 15 to 70 μm. The metal foil 83 is, for example, a copper foil having a thickness of approximately 0.5 to 5 μm.

The carrier layer 82 does not have to be formed from copper and may be a layer of a conductive metal other than copper or an insulative layer of resin or the like. Further, the metal foil 83 does not have to be formed from copper and may be formed from a metal other than copper.

A metal film 84 is formed on the lower surface 83A of the metal foil 83. The metal film 84 may be formed through, for example, electrolytic plating, sputtering, or vapor deposition. In the present example, the lower surface 83A of the metal foil 83 and the lower surface 84A of the metal film 84 are flat. The metal film 84 may be formed from a conductive material that allows the metal film 84 to be etched without etching the metal foil 83 and the wiring patterns 30 (refer to FIG. 2) formed in a subsequent step. The metal film 84 may be formed, for example, from a metal such as Ni, chromium (Cr), Sn, or Ag. Alternatively, the metal film 84 may be formed from an alloy including at least one metal selected from a group consisting of Ni, Cr, Sn, and Ag. In the present example, the metal film 84 is formed from Ni. The metal film 84 has a thickness of, for example, 1 to 10 μm.

Figure 5B:
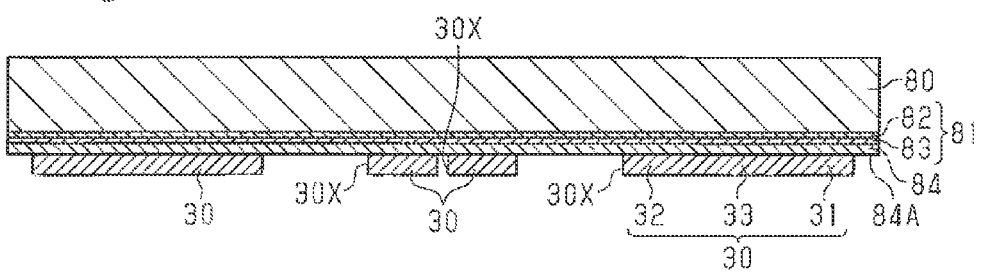

In the step of FIG. 5B, wiring patterns 30, each including the connection pad 31, the pad 32, and the circuit pattern 33, are formed on the lower surface 84A of the metal film 84. An opening 30X is formed between adjacent wiring patterns 30 to expose the lower surface 84a of the metal film 84. The wiring patterns 30 are formed through, for example, a semi-additive process. In the present example, a resist pattern (not illustrated) including openings corresponding to the shapes of the wiring patterns 30 are first formed on the lower surface 84A of the metal film 84. Electrolytic copper plating is performed using the metal film 84 as a power supplying layer to deposit a copper plating film on the lower surface 84A of the metal film 84 that is exposed from the openings of the resist pattern. Then, the resist pattern is removed. This forms the wiring patterns 30 on the lower surface 84A of the metal film 84 without the need for performing etching. Thus, the wiring patterns 30 can easily be reduced in size. Instead of the semi-additive process, the wiring patterns 30 may be formed through any of various types of wire formation processes such as a subtractive process.

Figure 5C:
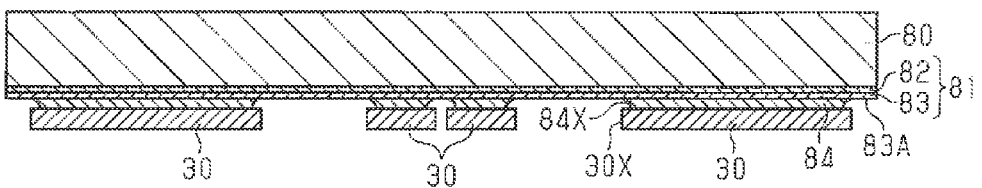

In the step of FIG. 5C, the wiring patterns 30 are used as an etching mask to etch portions of the metal film 84. This forms recesses 84X in the metal film 84. The recesses 84X expose portions of the lower surface 83A of the metal foil 83. Here, the metal foil 83 (Cu layer) functions as an etching stopper layer when etching the metal film 84. In other words, the metal film 84 is formed from a material such that the lower surface of the metal foil 83 is not etched when etching and removing the portions of the metal film 84 to form the recesses 84X in the metal film 84. Thus, the lower surface of the metal foil 83 remains flat even after the formation of the recesses 84X. Namely, referring to FIG. 5D, the lower surface of the metal foil 83 exposed to through each recess 84X and defining the bottom surface of each recess 84X is flat. The thickness of the metal film 84 defines the depth of the recess 84X. Thus, adjustment of the thickness of the metal film 84 allows the recesses 84X to be easily set to the desired depth.

Figure 5D:
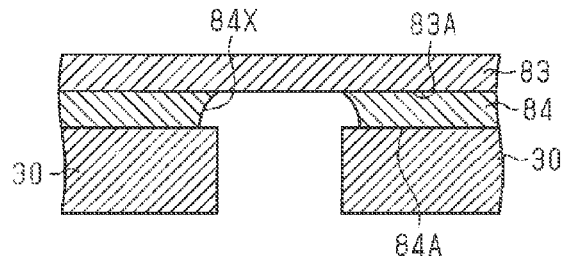

For example, when the material of the metal film 84 is Ni, isotropic etching is performed using a hydrogen peroxide-nitric acid solution to selectively remove the metal film 84 and form the recesses 84X. When performing isotropic etching, etching advances in the horizontal direction in addition to the vertical direction. This etches the side surfaces of the metal film 84 that are covered by the wiring patterns 30. Namely, referring to FIG. 5D, isotropic etching etches the side surfaces of the metal film 84 so that the wall surfaces of the recesses 84X are located on the upper surfaces of the wiring patterns 30. As a result, the periphery of the open end of each recess 84X is enlarged and located at the outer side of the corresponding opening 30X between the adjacent wiring patterns 30 (i.e., inner side of wiring patterns 30). In other words, the recesses 84X are formed to be slightly larger than the corresponding openings 30X in a plan view. The formation of the recesses 84X exposes the entire peripheral portion of the upper surface of each wiring pattern 30 from the metal film 84. The upper portion of each wall surface of the recess 84X (portion that contacts metal foil 83) is round so as to have, for example, a curved and inwardly bulged form in a cross-sectional view. That is, the wall surfaces of the recess 84X are formed to be arcuate in a cross-sectional view.

Figure 6A:
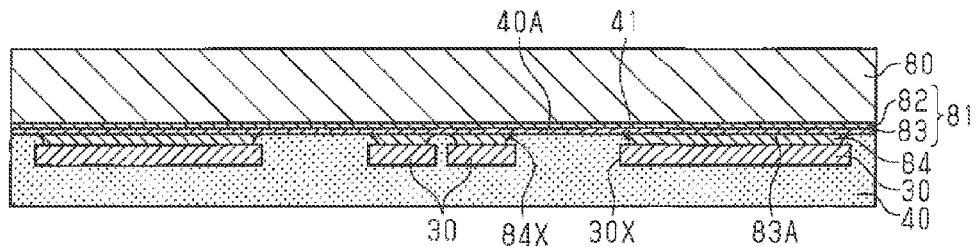
Figure 6B:
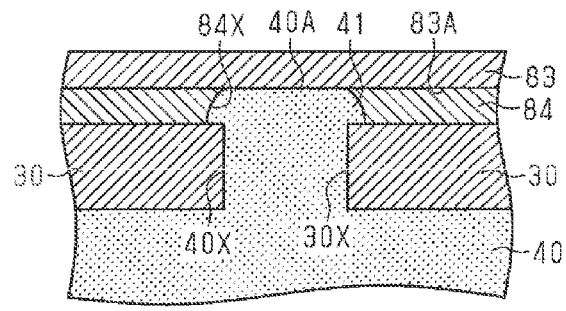

In the steps of FIGS. 6A and 6B, the insulation layer 40 is formed on the lower surface 83A of the metal foil 83 to cover the wiring patterns 30. The insulation layer 40 entirely covers the side surfaces and the lower surfaces of the wiring patterns 30. Further, the recesses 84X are filled with the insulation layer 40. Thus, the upper portion of the insulation layer 40 is projected upward from the upper surfaces of the wiring patterns 30 and onto the peripheral portion of the upper surface of each wiring pattern 30. This forms the covering portion 41 that contacts and covers the peripheral portion of the upper surface of the wiring pattern 30 at the upper portion of the insulation layer 40. The covering portion 41 continuously covers the entire peripheral portion of the upper surface of each wiring pattern 30. The covering portion 41, which contacts the wall surfaces of each recess 84X, is formed along the wall surfaces of the recess 84X. Thus, the covering portion 41 projects to have an arcuate cross section on the upper surface of corresponding wiring pattern 30. The upper surface 40A of the insulation layer 40 is formed along the bottom surface of each recess 84X, that is, along the lower surface 83A (flat surface) of the metal foil 83. Further, the depth of the recess 84X conforms to the thickness of the insulation layer 40 from the upper surface of the wiring pattern 30 to the upper surface 40A of the insulation layer 40 (i.e., projection amount of insulation layer 40 upwardly projecting from upper surface of wiring pattern 30). Thus, adjustment of the thickness of the metal film 84 allows the thickness of the insulation layer 40 from the upper surface of the wiring pattern 30 to the upper surface 40A of the insulation layer 40 to be easily adjusted to the desired thickness. This reduces differences in the projection amount of the insulation layer 40 from the upper surface of the wiring pattern 30.

The insulation layer 40 may be formed by, for example, a resin film. In this case, for example, the resin film is laminated on the lower surface 83A of the metal foil 83. Then, the resin film undergoes a heat treatment at a temperature of approximately 130° C. to 190° C. while pressed to form the insulation layer 40. Further, a liquid or paste of insulation resin may be used as the insulation layer 40. In this case, spin coating is performed to apply the liquid or paste of insulative resin to the lower surface 83A of the metal foil 83. The applied insulative resin undergoes a heat treatment at a temperature of approximately 130° C. to 190° C. This hardens the insulative resin and forms the insulation layer 40.

Figure 6C:
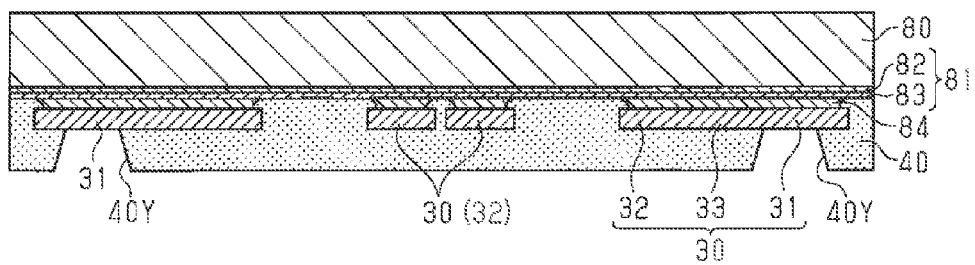

In the step of FIG. 6C, the through holes 40Y are formed in the insulation layer 40. The through holes 40Y partially expose the lower surface of each wiring pattern 30 (connection pad 31). The through holes 40Y may be formed through laser processing using, for example, a $CO_2$ laser, a YAG laser, or the like. When the insulation layer 40 is formed from a photosensitive resin, for example, photolithography may be performed to form the through holes 40Y.

When laser processing is performed to form the through holes 40Y, a desmearing process is performed to remove resin smears (resin residue) from the surface of the wiring layer 21 exposed in the through holes 40Y.

Figure 6D:
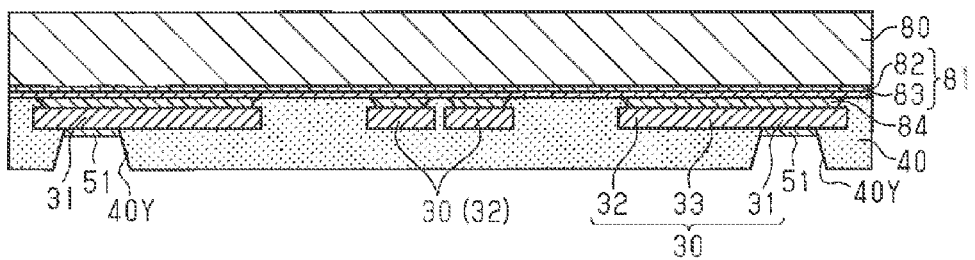

In the step of FIG. 6D, the surface-processed layer 51 is formed on the lower surface of each connection pad 31 exposed to the inside of the corresponding through hole 40Y. For example, when the surface-processed layer 51 is a Ni layer/Pd layer/Au layer, the surface-processed layer 51 is formed by stacking the Ni layer, the Pd layer, and the Au layer in this order on the lower surface of the connection pad 31. The Ni layer, the Pd layer, and the Au layer may be formed through, for example, electroless plating.

Figure 7A:
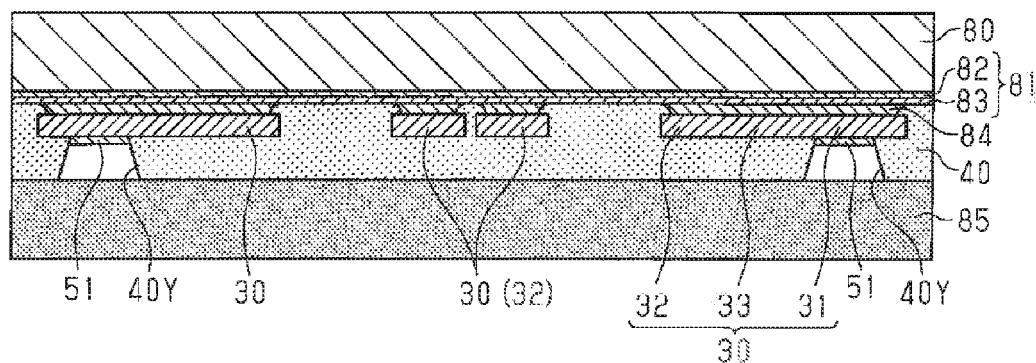

In the step of FIG. 7A, a support body 85 is applied to the lower surface of the insulation layer 40 with a delamination layer (not illustrated) located in between. The support body 85 may be formed by a polyethylene terephthalate (PET) film, a polyimide (PI) film, a polyethylene naphthalate (PEN) film, a metal plate, a glass plate, or the like.

Figure 7B:
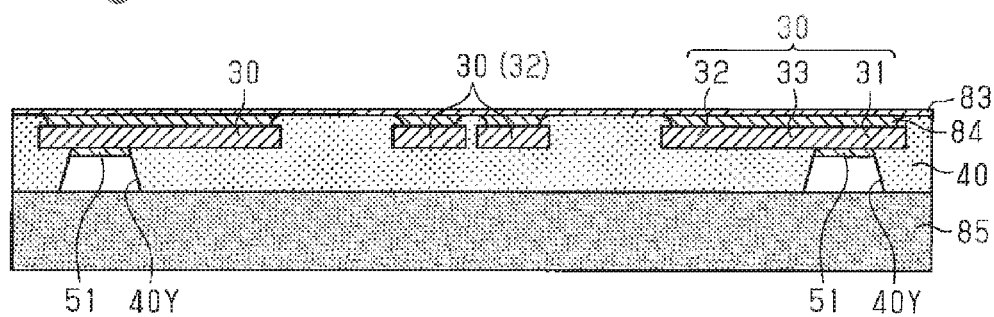

In the step of FIG. 7B, the support body 80 and the carrier layer 82 are removed. For example, the support body 80 and the carrier layer 82 are mechanically removed from the metal foil 83. Here, the delamination layer (not illustrated) is located between the carrier layer 82 and the metal foil 83. Thus, the adhesive force is low between the carrier layer 82 and the metal foil 83. This facilitates removal of the support body 80 and the carrier layer 82 from the metal foil 83. The removal of the support body 80 and the carrier layer 82 exposes the upper surface of the metal foil 83 to the outside as illustrated in FIG. 7B.

Figure 7C:
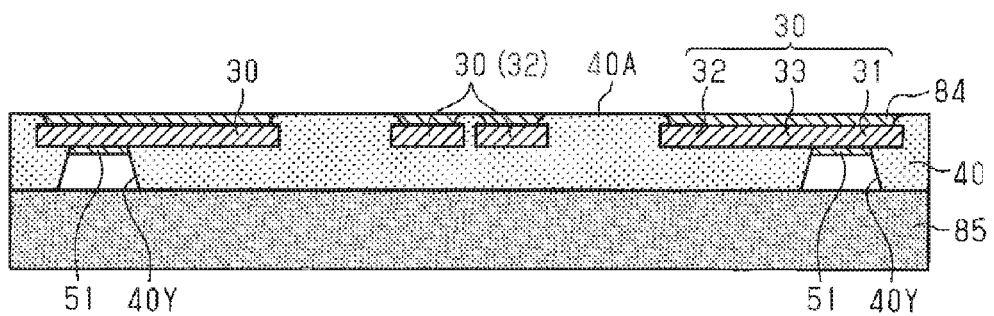

In the step of FIG. 7C, the metal foil 83 is removed. For example, when a copper foil is used as the metal foil 83, wet etching using a ferric chloride aqueous solution, a copper(II) chloride aqueous solution, an ammonium persulfate aqueous solution, or the like is performed to etch and remove the metal foil 83. The metal film 84 (Ni layer) and the insulation layer 40 function as an etching stopper layer when the metal foil 83 is etched. When the metal foil 83 is removed, the upper surface of the metal film 84 and the upper surface 40A of the insulation layer 40 are exposed to the outside as illustrated in FIG. 7C.

In the step of FIG. 8A, the metal film 84 is removed. For example, when a Ni layer is used as the metal film 84, wet etching is performed using hydrogen peroxide-nitric acid solution to etch and remove the metal film 84. The wiring patterns 30 (Cu layer) and the insulation layer 40 function as an etching stopper layer when the metal film 84 is etched. Removal of the metal film 84 partially exposes the upper surface of each wiring pattern 30 to the outside as illustrated in FIG. 8A. This forms a step in the structure illustrated in FIG. 8A with the upper surface 40A of the insulation layer 40, the side surface of the covering portion 41, and the upper surface of the wiring pattern 30.

In the step of FIG. 8B, the surface-processed layer 52 is formed on the upper surface of each pad 32 that is exposed from the insulation layer 40. For example, when the surface-processed layer 52 is a Ni layer/Pd layer/Au layer, the surface-processed layer 52 is formed by stacking the Ni layer, the Pd layer, and the Au layer in this order on the upper surface of the pad 32. The Ni layer, the Pd layer, and the Au layer may be formed through, for example, electroless plating.

In the step of FIG. 8C, the support body 85 is removed. For example, the support body 85 is mechanically removed from the insulation layer 40. Here, the delamination layer (not illustrated) is located between the support body 85 and the insulation layer 40. Thus, the adhesive force is low between the support body 85 and the insulation layer 40. This facilitates removal of the support body 85 from the insulation layer 40. Thus, the removal of the support body 85 does not inflict damages to the lower surface of the insulation layer 40. The removal of the support body 85 exposes the lower surface of the insulation layer 40 to the outside as illustrated in FIG. 8C. The wiring substrate 20 of the first embodiment is manufactured through the manufacturing steps described above.

A method for manufacturing the semiconductor device 10 will now be described.

In the step of FIG. 8D, the semiconductor element 60 including the cylindrical connection terminals 61 is prepared. The connection terminals 61 are manufactured through a known method and thus will not be described in detail. For example, the connection terminals 61 are manufactured as described below.

First, for example, a protection film is formed on the circuit formation surface (here, lower surface) of the semiconductor element 60. The protection film includes openings that expose electrode pads formed on the circuit formation surface. A seed layer is formed covering the lower surface of the protection film and the lower surface of each electrode pad. Further, a resist layer is formed on the seed layer at portions corresponding to the regions where the connection terminals 61 are formed (portions of seed layer covering lower surfaces of electrode pads). Then, electrolytic plating (e.g., electrolytic copper plating) is performed using the seed layer as a power supplying layer to form the cylindrical connection terminals 61 on the seed layer (electrode pads) exposed from the resist layer.

The joining members 62 are formed on the lower surface of each connection terminal 61. The joining members 62 are formed by, for example, performing electrolytic plating using the resist layer formed on the seed layer as a plating mask and using the seed layer as a plating power supplying layer to cover the lower surface of each connection terminal 61 with solder and form the joining member 62. Then, the unnecessary seed layer and resist layer are removed.

The connection terminals 61 of the semiconductor element 60 are each flip-chip-bonded to the surface-processed layer 52 of the wiring substrate 20. For example, the wiring substrate 20 is aligned with the semiconductor element 60, and a reflow process is performed to melt the joining members 62 (solder plating layer) and electrically connect each of the connection terminals 61 to the surface-processed layer 52. As a result, the joining members 62 and the surface-processed layer 52 electrically connect the connection terminals 61 to the wiring patterns 30.

Then, the gap between the flip-chip-bonded semiconductor element 60 and the wiring substrate 20 is filled with the underfill 65 (refer to FIG. 2), and the underfill 65 is hardened.

The encapsulation resin 66 (refer to FIG. 2) that encapsulates the semiconductor element 60 is formed on the insulation layer 40 of the wiring substrate 20. For example, a thermosetting mold resin may be used as the encapsulation resin 66. In this case, the structure including the underfill 65 is placed in a mold. The mold is adjusted to a given pressure (e.g., 5 to 10 MPa). Then, fluidized mold resin is drawn into the mold. The mold resin is heated and hardened at a temperature of approximately 180° C. to form encapsulation resin. The mold resin may be drawn into the mold through transfer molding, compression molding, or injection molding.

Then, the external connection terminals 70 (refer to FIG. 2) are formed on the surface-processed layer 51 of the wiring substrate 20. For example, flux is applied to the surface-processed layer 51, and the external connection terminals 70

(here, solder balls) are mounted on the surface-processed layer 51. Then, a reflow process is performed at a temperature of approximately 240° C. to 260° C. to fix the external connection terminals 70 to the surface-processed layer 51. Further, a surface cleaning process is performed to remove the flux. The above manufacturing steps manufacture the semiconductor device 10 illustrated in FIG. 2.

The first embodiment has the advantages described below.

(1) The insulation layer 40 covers the lower surfaces of the wiring patterns 30 and the side surfaces of the wiring patterns 30. The insulation layer 40 includes the covering portion 41 that continuously covers the entire peripheral portion of the upper surface of each wiring pattern 30. The insulation layer 40 contacts the six surfaces of each wiring pattern 30, namely, the four side surfaces, the lower surface, and the upper surface, and holds the wiring pattern 30. This limits delamination of the wiring pattern 30 from the insulation layer 40.

(2) The upper surface 40A of the insulation layer 40 is located upward from the upper surface of each wiring pattern 30. Thus, the upper surface of the wiring pattern 30 is located at a lower position than the upper surface 40A of the insulation layer 40. This limits scratching of the upper surface of the wiring pattern 30.

(3) For example, when the upper surface of each wiring pattern 30 is flush with the upper surface of the insulation layer 40, the upper surface of the insulation layer 40 between the adjacent wiring patterns 30 will be straight (flat) in a cross-sectional view. Such a structure decreases the distance of the upper surface of the insulation layer 40 between the adjacent wiring patterns 30. Thus, migration is apt to occur. This lowers the insulation reliability between the adjacent wiring patterns 30. Therefore, the conventional wiring substrate needs to improve the insulation reliability.

In this respect, the wiring substrate 20 of the first embodiment has the upper surface 40A of the insulation layer 40 located upward from the upper surface of each wiring pattern 30. This partially covers the upper surface of the wiring pattern 30 with the insulation layer 40. Further, a step is formed by the upper surface 40A and the side surface of the insulation layer 40 and the upper surface of the wiring pattern 30. Thus, the distance of the surface of the insulation layer 40 (side surface and upper surface 40A) between the adjacent wiring patterns 30 is longer than that of the above-described conventional wiring substrate. Accordingly, in the wiring substrate 20, the occurrence of migration is limited between the adjacent wiring patterns 30, and the insulation reliability is improved between the adjacent wiring patterns 30.

(4) The side surfaces of the insulation layer 40, which partially cover the upper surfaces of the wiring patterns 30, that is, the side surface of the covering portion 41 is curved and outwardly bulged. This improves the fluidity of the underfill 65 and improves the filling properties of the underfill 65. The covering portion 41, which is curved and outwardly bulged, is formed on the pads 32 and on the circuit patterns 33 (refer to FIG. 4). This improves the fluidity of the underfill 65 in the entire mounting region.

(5) The metal film 84 is formed on the lower surface of the support substrate that includes the support body 80 and the carrier-incorporated metal foil 81, and the wiring patterns 30 are formed on the lower surface of the metal film 84. Then, etching is performed using the wiring patterns 30 as an etching mask and using the support substrate as an etching stopper layer to remove portions of the metal film 84 and forms the recesses 84X in the metal film 84. The recesses 84X are filled with the insulation layer 40 that covers the lower surfaces and the side surfaces of the wiring patterns 30. Thus, adjustment of the thickness of the metal film 84 allows for adjustment of the depth of the recesses 84X, that is, the projection amount of the insulation layer 40 from the upper surfaces of the wiring patterns 30. Accordingly, differences are reduced in the projection amount of the insulation layer 40 from the upper surfaces of the wiring patterns 30.

Second Embodiment

A second embodiment will now be described with reference to FIGS. 9 to 12. A semiconductor device 10A of the second embodiment differs from the first embodiment in the structure of the wiring patterns 30 in a wiring substrate 20A. The description hereafter will focus on the differences from the first embodiment. Same reference numerals are given to those components that are the same as the corresponding components illustrated in FIGS. 1 to 8D. Such components will not be described in detail.

Figure 12:
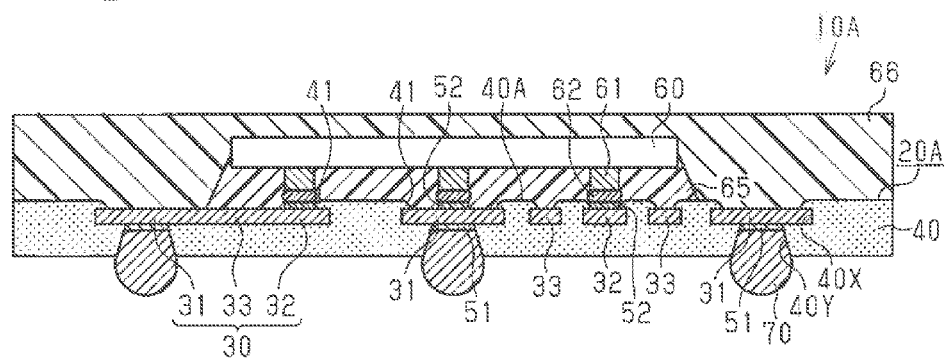
FIG. 12 is a schematic cross-sectional view illustrating a semiconductor device including the wiring substrate of FIG. 9 taken along line 12-12 in FIG. 10.

Referring to FIG. 12, the semiconductor device 10A includes the wiring substrate 20A, the semiconductor element 60 that is flip-chip mounted on the wiring substrate 20A, the underfill 65, the encapsulation resin 66, and the external connection terminals 70. One or more semiconductor elements 60 may be flip-chip mounted on the wiring substrate 20A. In the present example, there is only one semiconductor element 60.

Referring to FIG. 9, each wiring pattern 30 of the wiring substrate 20A includes the connection pad 31, the pad 32, and the circuit pattern 33. The pad 32 is located inside the mounting region. The circuit pattern 33 connects the connection pad 31 and the pad 32.

Figure 10:
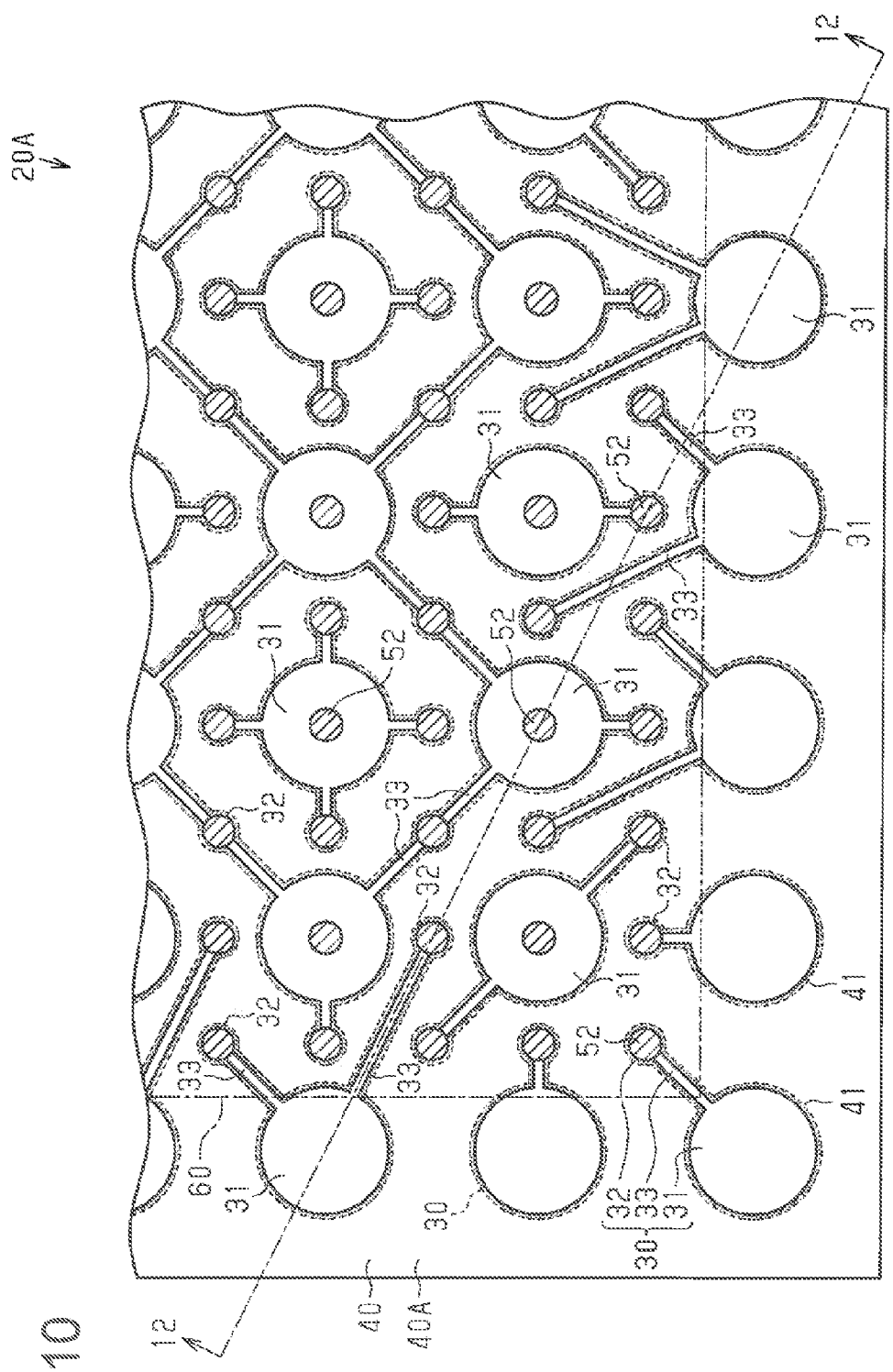
FIG. 10 is a partial, enlarged plan view illustrating the wiring substrate of FIG. 9.

In the present example, referring to FIG. 10, each wiring pattern 30 serve as a first wiring pattern, a second wiring pattern, or a third wiring pattern. The first wiring pattern 30 includes a single connection pad 31, a single pad 32, and a circuit pattern 33 that connects the connection pad 31 and the pad 32. The second wiring pattern 30 includes a single connection pad 31, a plurality of pads 32, and a plurality of circuit patterns 33, each connecting the connection pad 31 to one of the pads 32. The third wiring pattern 30 includes a plurality of connection pads 31, a plurality of pads 32, and a plurality of circuit patterns 33, each connecting one of the connection pads 31 to one of the pads 32.

Figure 11:
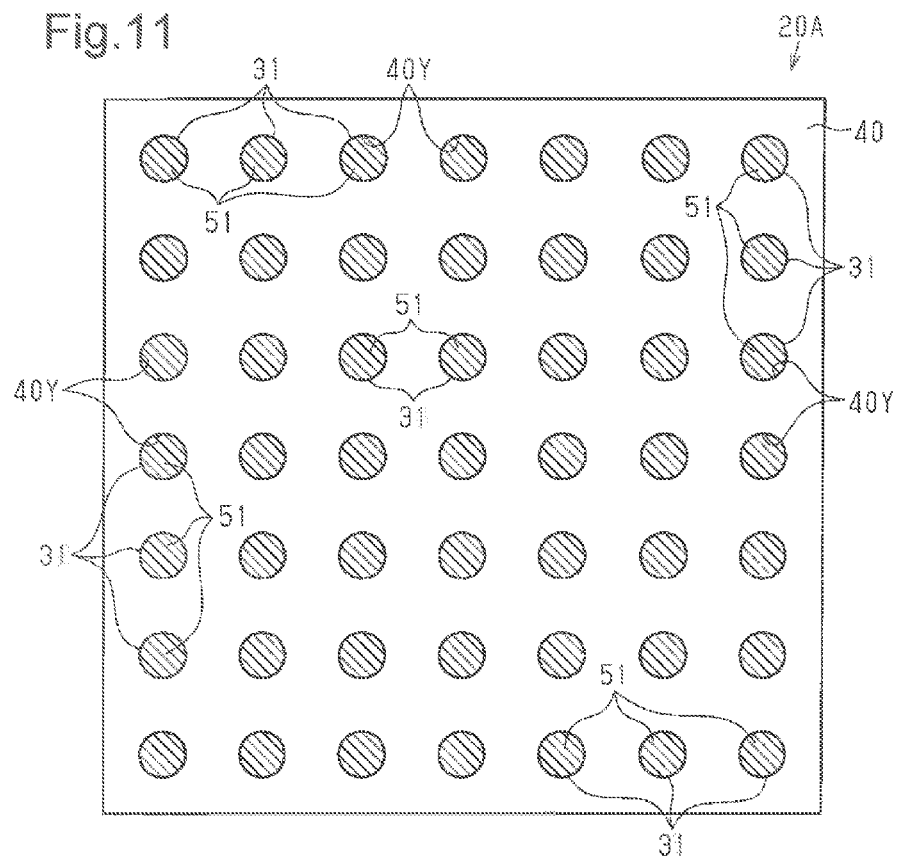
FIG. 11 is a schematic plan view illustrating the wiring substrate of FIG. 9.

Referring to FIGS. 9 and 11, the connection pads 31 are laid out throughout the wiring substrate 20A in a grid array, more specifically, an area array. In other words, the connection pads 31 are laid out on the insulation layer 40 in a matrix (here, 7×7) in a plan view. As illustrated in FIG. 9, each connection pad 31 is located in the region where the semiconductor element 60 is mounted or a region outside the mounting region. Each connection pad 31 is, for example, circular in a plan view. Each connection pad 31 is, for example, larger than the pad 32 in a plan view. FIG. 9 is an upper plan view of the wiring substrate 20A illustrated in FIG. 12, and FIG. 11 is a lower plan view of the wiring substrate 20A illustrated in FIG. 12.

As illustrated in FIGS. 11 and 12, the lower surface of each connection pad 31 is partially exposed from the corresponding through hole 40Y in the insulation layer 40. The surface-processed layer 51 is formed on the entire surface of the connection pad 31 that is exposed to the inside of the through hole 40Y.

Referring to FIG. 9, the surface-processed layer 52 is formed on the upper surface of each connection pad 31 that is located in the mounting region. Thus, as illustrated in FIG.

12, for each connection pad 31 located in the mounting region, the surface-processed layer 51 is formed on the lower surface of the connection pad 31, and the surface-processed layer 52 is formed on the upper surface of the connection pad 31. In other words, with regard to each connection pad 31 located in the mounting region, the lower surface of the connection pad 31 functions as an external connection pad, and the upper surface of the connection pad 31 functions as a semiconductor element mounting pad.

The surface-processed layer 52 is also formed on the entire upper surface of each pad 32 exposed from the insulation layer 40. In the present example, as illustrated in FIG. 9, the pads 32 are laid out in the mounting region in a grid array, more specifically, an area array. In other words, the pads 32 are laid out on the wiring patterns 30 in a matrix (here, 11×11) in a plan view. The surface-processed layer 52 is formed on the upper surface of each pad 32.

Referring to FIG. 10, in the same manner as the first embodiment, the insulation layer 40 includes the covering portion 41 that continuously covers the entire peripheral portion of the upper surface of each wiring pattern 30 (i.e., connection pad 31, pad 32, and circuit pattern 33). Thus, in the upper surface of each wiring pattern 30, a region slightly smaller than the contour of the wiring pattern 30 (refer to broken lines in FIG. 10) is exposed to the outside from the insulation layer 40.

The second embodiment has the same advantages as the first embodiment. The wiring substrate 20A and the semiconductor device 10A are manufactured through the same method as the first embodiment. Thus, the manufacturing method will not be described.

Third Embodiment

A third embodiment will now be described with reference to FIGS. 13A to 13D. The third embodiment differs from the first embodiment in the method for manufacturing the wiring substrate 20. The description hereafter will focus on the differences from the first embodiment. Same reference numerals are given to those components that are the same as the corresponding components illustrated in FIGS. 1 to 12. Such components will not be described in detail.

Figure 13A:
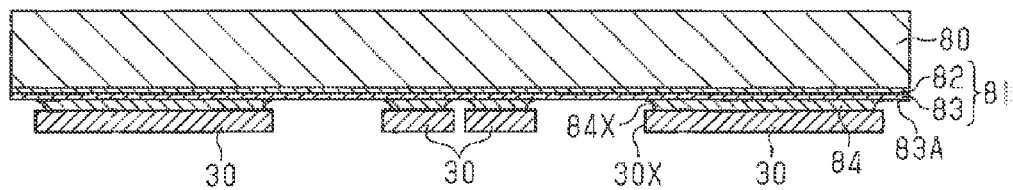
FIGS. 13A to 13D are schematic cross-sectional views illustrating a method for manufacturing a wiring substrate in a third embodiment.

The steps of FIGS. 5A to 5C are performed to manufacture the structure illustrated in FIG. 13A.

Figure 13B:
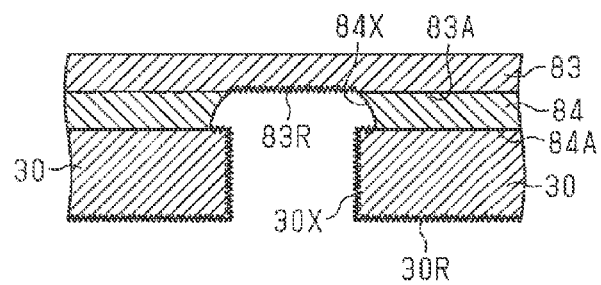

In the step of FIG. 13B, a roughening process is performed on the Cu layers exposed on the surface of the structure illustrated in FIG. 13A, that is, the wiring patterns 30 and the metal foil 83. The roughening process forms fine ridges and valleys in the lower surfaces and the side surfaces of the wiring patterns 30. Thus, the entire lower surfaces and the entire side surfaces of the wiring pattern 30 are roughened into roughened surfaces 30R. The roughening process also forms fine ridges and valleys in the entire peripheral portion of the upper surface of each wiring pattern 30 that is exposed to the inside of the corresponding recess 84X. Thus, the entire peripheral portion of the upper surface of each wiring pattern 30 is also roughened into a roughened surface 30R. Additionally, the roughening process forms fine ridges and valleys in the lower surface 83A of the metal foil 83 that is exposed to the inside of each recess 84X. Thus, the exposed lower surface 83A of the metal foil 83 is roughened into a roughened surface 83R. For example, the wiring patterns 30 and the metal foil 83 prior to the roughening process (or when covered by the metal film 84) have a surface roughness Ra of approximately 1 to 300 nm, whereas the wiring patterns 30 and the metal foil 83 subsequent to the roughening process have a surface roughness Ra of approximately 100 to 700 nm. In other words, the roughening process roughens the exposed surfaces of the wiring patterns 30 and the metal foil 83 into roughened surfaces having a surface roughness Ra of approximately 100 to 700 nm. The surface roughness Ra is referred to as the arithmetic average roughness that is the arithmetic average of the absolute value of a height, which varies within a measured region and which is measured from a surface serving as an average line.

The roughening process illustrated in FIG. 13B may be performed through, for example, an etching or a black oxidation. When performing an etching as the roughening process, for example, the conditions of an etching liquid or the like are set so that the surface of the metal film 84 (e.g., Ti layer) is not roughened when etching the wiring patterns 30 and the metal foil 83 (e.g., Cu layers). Thus, the metal film 84 is unaffected by the roughening process, and the surface of the metal film 84 is not roughened. Accordingly, the wall surfaces of each recess 84X remain smooth and have a smaller roughness than the roughened surfaces 30R and 83R. The etching liquid used for the roughening process (etching process) may be a ferric chloride aqueous solution, a copper(II) chloride aqueous solution, an ammonium persulfate aqueous solution, or the like.

Figure 13C:
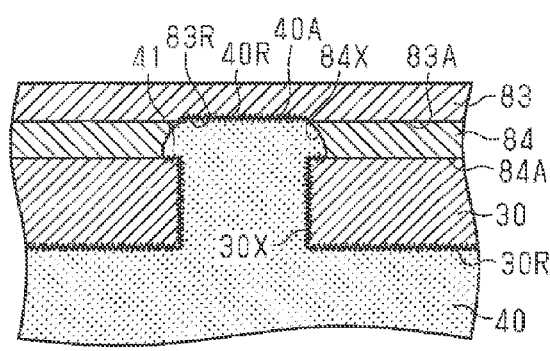

In the step of FIG. 13C, the insulation layer 40 is formed on the lower surface 83A of the metal foil 83 to cover the wiring patterns 30 in the same manner as the steps of FIGS. 6A and 6B. The insulation layer 40 entirely covers the side surfaces and the lower surfaces of the wiring patterns 30. Further, the recesses 84X are filled with the insulation layer 40. As a result, the covering portion 41 is formed in the upper portion of the insulation layer 40 contacting and covering the entire peripheral portion of the upper surface of each wiring pattern 30. All of the surfaces of each wiring pattern 30 contacting the insulation layer 40 (i.e., entire lower surface of each wiring pattern 30, entire side surface of each wiring pattern 30, and entire peripheral portion of upper surface of wiring pattern 30) are the roughened surfaces 30R. Thus, the adhesion of the wiring patterns 30 and the insulation layer 40 is improved as compared with when the entire surfaces of each wiring pattern 30 are smooth surfaces. This limits delamination of wiring patterns 30 from the insulation layer 40.

The upper surface 40A of the insulation layer 40 is formed along the lower surface 83A of the metal foil 83 that defines the bottom surface of each recess 84X, that is, along the roughened surface 83R. This forms a roughened surface 40R in the insulation layer 40 that has generally the same roughness as the roughened surface 83R. That is, the roughened surface 40R has a surface roughness that is, for example, approximately 100 to 700 nm in surface roughness Ra. The side surface of the covering portion 41 is formed along the wall surface (smooth surface) of each recess 84X. This forms the side surface of the covering portion 41 as a smooth surface having a smaller roughness than the roughened surface 40R. In this manner, the side surface of the upper portion of the insulation layer 40 projecting upward from the wiring patterns 30 (i.e., side surface of covering portion 41) is smooth surfaces, and the upper surface 40A of the insulation layer 40 is the roughened surface 40R that has a larger roughness than the side surface of the covering portion 41.

Figure 13D:
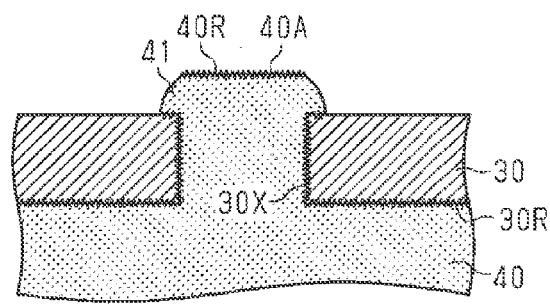

Then, the support body 80, the carrier layer 82, the metal foil 83, and the metal film 84, which are illustrated in FIG. 13A, are removed in the same manner as the steps of FIGS. 6C to 8A. Referring to FIG. 13D, the upper surface of each wiring pattern 30, the upper surface 40A of the insulation layer 40 (roughened surface 40R), and the side surface of the covering portion 41 are exposed to the outside.

Subsequently, steps that are the same as the steps of FIGS. 8B and 8C are performed to manufacture the wiring substrate 20 of the third embodiment.

In addition to advantages (1) to (5) of the first embodiment, the third embodiment has the advantages described below.

(6) All of the surfaces of each wiring pattern 30 (entire side surface, entire lower surface, and entire peripheral portion of upper surface) that are in contact with the insulation layer 40 are formed as the roughened surfaces 30R. This produces an anchoring effect that improves the adhesion of the wiring pattern 30 and the insulation layer 40. Accordingly, delamination of the wiring patterns 30 from the insulation layer 40 is limited.

(7) The upper surface 40A of the insulation layer 40 is formed as the roughened surface 40R. This increases the length of the surface of the insulation layer 40 (upper surface 40A and side surfaces) between adjacent wiring patterns 30 as compared to when the upper surface 40A is a smooth surface. As a result, the occurrence of migration is reduced between adjacent wiring patterns 30, and the insulation reliability between adjacent wiring patterns 30 is further improved.

(8) The upper surface 40A of the insulation layer 40 is formed as the roughened surface 40R. This improves the adhesion of the insulation layer 40 and the underfill 65. When a solder resist layer is formed in a region outside the mounting region, the adhesion of the solder resist layer and the upper surface 40A (roughened surface 40R) of the insulation layer 40 can be improved.

(9) The upper surface 40A of the insulation layer 40 is formed as the roughened surface 40R. However, the side surface of the covering portion 41 is a smooth surface that is curved and outwardly bulged. This improves the migration resistance and improves the fluidity of the underfill 65.

It should be apparent to those skilled in the art that the foregoing embodiments may be employed in many other specific forms without departing from the scope of this disclosure. Particularly, it should be understood that the foregoing embodiments may be employed in the following forms.

Figure 14A:
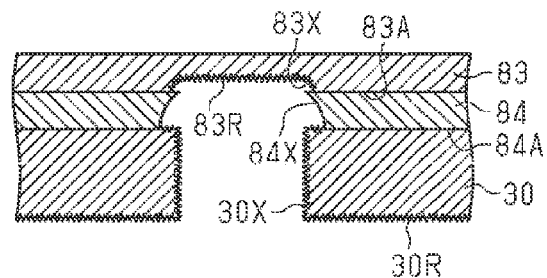
FIGS. 14A to 14C are schematic cross-sectional views illustrating a method for manufacturing a wiring substrate in a modified example.
Figure 14B:
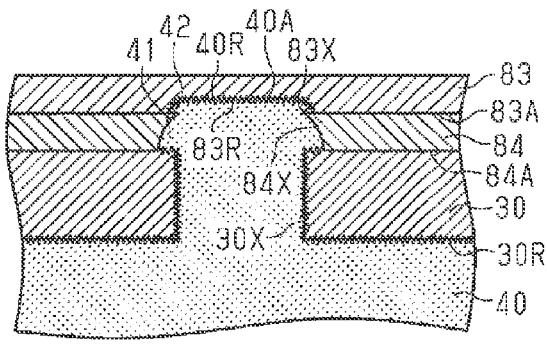
Figure 14C:
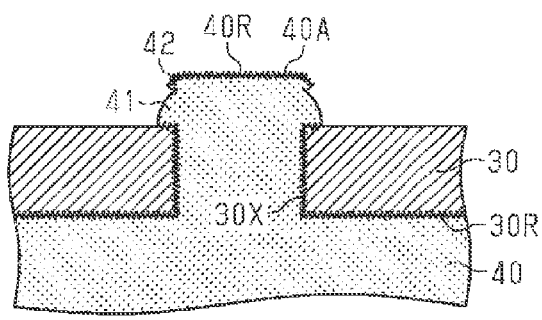

The wiring substrate 20 may be formed through the manufacturing steps illustrated in FIGS. 14A to 14C. The step of FIG. 14A is performed in lieu of the step of FIG. 13B.

In the step of FIG. 14A, the roughening process is selectively performed on the wiring patterns 30 and the metal foil 83. In this step, the roughening process is performed so that recesses 83X are formed in the lower surface 83A of the metal foil 83 expanding from the recesses 84X, respectively. The roughening process forms the entire peripheral portion of the upper surface of each wiring pattern 30, the entire lower surface of each wiring pattern 30, and the entire side surface of each wiring pattern 30 as roughened surfaces 30R. Further, a roughened surface 83R is formed in the entire inner surfaces of each recess 83X (entire wall surface and entire bottom surface).

In the step of FIG. 14A, for example, the roughening process may be performed through isotropic etching using a ferric chloride aqueous solution, a copper(II) chloride aqueous solution, an ammonium persulfate aqueous solution, or the like. The isotropic etching allows the roughening process to be performed selectively on the surfaces of each recess 83X and the surfaces of each wiring pattern 30 while forming the recess 83X. That is, the exposed surface of the metal foil 83 exposed to the outside through each recess 84X undergoes isotropic etching to form the recesses 83X so that the wall surfaces of the recesses 83X are located on the upper surface of the metal film 84. As a result, each recess 83X is slightly larger than the corresponding recess 84X in a plan view. The formation of the recesses 83X exposes the upper surface of the metal film 84 from the metal foil 83 around the corresponding recesses 84X. The upper surface of the metal film 84 exposed from the metal foil 83 is a smooth surface having a smaller surface roughness than the roughened surfaces 30R and 83R. In the present example, the bottom surface of the recess 83X is located at an intermediate position of the metal foil 83 in the thicknesswise direction.

In the step of FIG. 14B, the insulation layer 40 is formed on the lower surface 83A of the metal foil 83 to cover the wiring patterns 30 in the same manner as steps of FIGS. 6A and 6B. The insulation layer 40 entirely covers the side surfaces and the lower surface of each wiring pattern 30. Further, each recess 84X is filled with the insulation layer 40. Additionally, each recess 83X is also filled with the insulation layer 40. Thus, the upper portion of the insulation layer 40 is projected further upward from the covering portion 41 and partially extended onto the upper surface of the metal film 84. This forms a projection 42 in the upper portion of the insulation layer 40. The projection 42 projects further toward the outer side (i.e., inner side of wiring pattern 30) from the upper end of the covering portion 41. That is, the upper portion of the insulation layer 40 forms a step with the covering portion 41 and the projection 42.

The side surface of each projection 42 is formed along the wall surface of the corresponding recess 83X, namely, the roughened surface 83R. Thus, the side surface of the projection 42 is formed as a roughened surface 40R having generally the same roughness as the roughened surface 83R. In the same manner, the upper surface 40A of the insulation layer 40 is formed as the roughened surface 40R. The lower surface of the projection 42 is formed along the upper surface (smooth surface) of the metal film 84 and is thus formed as a smooth surface having a smaller roughness than the roughened surface 40R.

Then, the support body 80, the carrier layer 82, the metal foil 83, and the metal film 84, which are illustrated in FIG. 13A, are removed in the same manner as the steps of FIGS. 6C to 8A. Referring to FIG. 14C, this exposes the upper surface of each wiring pattern 30, the upper surface 40A (roughened surface 40R) of the insulation layer 40, the side surface of the covering portion 41, and the side surface and lower surface of each projection 42 to the outside.

Then, the steps of FIGS. 8B and 8C are performed to manufacture the wiring substrate 20 of the modified example.

In the wiring substrate 20 manufactured through the method illustrated in FIGS. 14A to 14C, the upper surface 40A of the insulation layer 40 and the side surface of the projection 42 are formed as the roughened surfaces 40R. This further improves the adhesion of the insulation layer 40 and the underfill 65.

The manufacturing method of the third embodiment may be applied to the method for manufacturing the wiring substrate 20A of the second embodiment. Further, the manufacturing method illustrated in FIGS. 14A to 14C may be applied to the method for manufacturing the wiring substrate 20A of the second embodiment.

The wiring substrates 20 and 20A of the above embodiments each include a single wiring layer (wiring patterns 30) and a single insulation layer 40. Instead, the wiring substrates 20 and 20A may each include a plurality of wiring layers and a plurality of insulation layers that are alternately stacked. One example of a wiring substrate including a plurality of wiring layers and a plurality of insulation layers will now be described.

Figure 15:
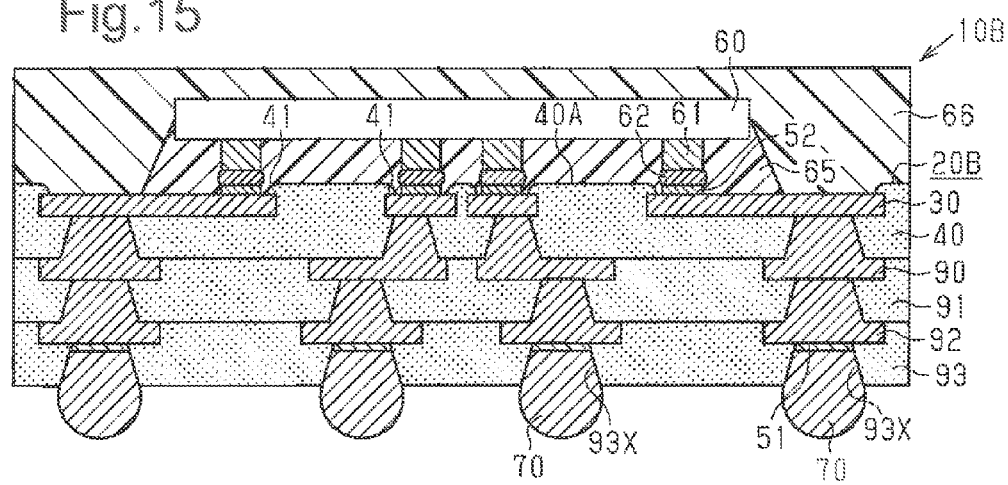
FIG. 15 is a schematic cross-sectional view illustrating a semiconductor device in a modified example.

For example, in a wiring substrate 20B illustrated in FIG. 15, a wiring layer 90, an insulation layer 91, a wiring layer 92, and an insulation layer 93 are sequentially formed on the lower surface of the insulation layer 40. The wiring layers 90 and 92 may be formed from, for example, copper or a copper alloy. The insulation layers 91 and 93 may be formed from, for example, an insulative resin, such as an epoxy resin or a polyimide resin, or a resin material obtained by mixing such an insulative resin with a filler, such as silica or alumina.

The wiring layer 90 is formed on the lower surface of the insulation layer 40. The wiring layer 90 is electrically connected to the wiring patterns 30 by via wiring extending through the insulation layer 40 in the thickness-wise direction. The insulation layer 91 is formed on the lower surface of the insulation layer 40 to cover the wiring layer 90. The wiring layer 92 is formed on the lower surface of the insulation layer 91. The wiring layer 92 is electrically connected to the wiring layer 90 by via wiring extending through the insulation layer 91 in the thickness-wise direction. The insulation layer 93 is formed on the lower surface of the insulation layer 91 to cover the wiring layer 92. The insulation layer 93 includes through holes 93X exposing portions of the lower surface of the lowermost wiring layer 92 to the outside as external connection pads. The surface-processed layer 51 is formed on the lower surface of the wiring layer 92 exposed to the outside through the through holes 93X.

The wiring substrate 20B of FIG. 15B may be, for example, manufactured through the method described below. For example, after the insulation layer 40 is formed in the step of FIG. 6A, the wiring layer 90, the insulation layer 91, the wiring layer 92, and the insulation layer 93 are sequentially formed on the lower surface of the insulation layer 40. Then, the steps illustrated in FIGS. 7A to 8C are performed to manufacture the wiring substrate 20B.

The semiconductor devices 10 and 10A of the above embodiments may be changed to a semiconductor device 10B including the wiring substrate 20B as illustrated in FIG. 15. In the semiconductor device 10B, the external connection terminals 70 are formed on the surface-processed layer 51 of the wiring substrate 20B, and the semiconductor element 60 is flip-chip-bonded to the surface-processed layer 52 of the wiring substrate 20B.

In the semiconductor device 10 of the first embodiment, after the semiconductor element 60 is flip-chip-mounted on the wiring substrate 20, the gap between the wiring substrate 20 and the semiconductor element 60 is filled with the underfill 65. Instead, for example, the underfill 65 may be first formed on the wiring substrate 20 in a semi-cured state. Then, the underfill 65 may be thermally hardened after the semiconductor element 60 is flip-chip-mounted on the wiring substrate 20. In this case, when flip-chip-mounting the semiconductor element 60, the connection terminals 61 and the joining members 62 of the semiconductor element 60 are pierced through the underfill 65 of the semi-cured state, and the connection terminals 61 are abut against the surface-processed layer 52 through the joining member 62.

The method for manufacturing the semiconductor devices 10A and 10B may be modified in the same manner.

The underfill 65 may be omitted from each of the above embodiments. In this case, for example, the gap between the semiconductor element 60 and the corresponding one of the wiring substrates 20, 20A, and 20B may be encapsulated by the encapsulation resin 66.

In the first embodiment, the support body 85 is removed after the surface-processed layer 52 is formed (refer to FIGS. 8B and 8C). Instead, for example, the support body 85 may be removed after the encapsulation resin 66 is formed. In other words, the support body 85 may be removed at any time from when the surface-processed layer 52 is formed to when the encapsulation resin 66 is formed.

The method for manufacturing the semiconductor devices 10A and 10B may be modified in the same manner.

In each of the above embodiments, the wiring patterns 30 and the insulation layer 40 are formed on one side of the support substrate, and the support substrate is finally removed to manufacture the coreless wiring substrate 20. Instead, for example, the metal film 84 may be formed on the opposite sides of the support substrate, and the wiring patterns 30 and the insulation layer 40 may be formed on the metal film 84 on each side of the support substrate. Finally, the support substrate and the metal films 84 are removed. This manufactures a plurality of coreless wiring substrates 20.

In each of the above embodiments, the manufacturing method is directed to the production of a single product. However, the method for manufacturing the wiring substrates 20, 20A, and 20B (semiconductor devices 10, 10A, and 10B) may be directed to the production of products in batches.

In each of the above embodiments, the surface-processed layer 52 is formed on a portion of the upper surface of each wiring pattern 30 exposed from the insulation layer 40. Instead, for example, the surface-processed layer 52 may be formed on the entire upper surface of each wiring pattern 30 (connection pad 31, pad 32, and circuit pattern 33) exposed from the insulation layer 40.

In each of the above embodiments, the surface-processed layer 51 may be omitted.

In each of the above embodiments, the surface-processed layer 52 may be omitted.

In each of the above embodiments, the layout of the wiring patterns may be changed in the wiring substrates 20, 20A, and 20B.

In each of the embodiments, the electronic component mounted on the wiring substrates 20, 20A, and 20B is not limited to the semiconductor element 60. Instead of the semiconductor element 60, a chip component such as a chip capacitor, a chip resistor, and a chip inductor, or an electronic component such as a quartz oscillator may be mounted.

The number of components mounted on the wiring substrates 20, 20A, and 20B and the mounting mode of the electronic component (e.g., flip-chip mounting, wire-bonding mounting, solder mounting, or a combination of these mounting modes) may be changed.

In each of the above embodiments, the semiconductor element 60 or the like is mounted on the wiring substrates 20, 20A, and 20B. However, the mounted component is not limited to an electronic component. For example, the structure of each embodiment may be applied to a package-on-package having a structure in which another wiring substrate is formed on the wiring substrate 20, 20A, 20B.

CLAUSES

This disclosure encompasses the following embodiments.

1. A method for manufacturing a wiring substrate, the method including:

preparing a support substrate;

forming a metal film on a lower surface of the support substrate;

forming wiring patterns on a lower surface of the metal film;

forming recesses in the metal film by etching and removing portions of the metal film using the wiring patterns as masks and using the support substrate as an etching stopper layer so that the recesses expose an entire peripheral portion of an upper surface of each of the wiring patterns;

forming an insulation layer that covers an entire lower surface and an entire side surface of each of the wiring patterns, wherein the recesses are filled with the insulation layer;

removing the support substrate; and removing the metal film, wherein the forming an insulation layer includes forming a covering portion by a portion of the insulation layer so that the covering portion continuously covers the entire peripheral portion of the upper surface of each of the wiring patterns and so that the recesses are filled with the covering portion.

2. The method according to clause 1, further including, after the recesses are formed and before the insulation layer is formed, roughening the entire lower surface of each wiring pattern, the entire side surface of each wiring pattern, and the entire peripheral portion of the upper surface of each wiring pattern and roughening an exposed portion of the support substrate exposed in each recess.

3. The method according to clause 1 or 2, wherein the forming recesses includes performing isotropic etching to remove the portions of the metal film.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:

a wiring pattern including an electrode pad and a circuit pattern, wherein the electrode pad is formed in a mounting region where a discrete electronic component or an integrated circuit (IC) chip is mounted, and the circuit pattern extends in a planar direction from the electrode pad; and an insulation layer that covers a bottom surface of the wiring pattern and a side surface of the wiring pattern and partially exposes a top surface of the wiring pattern, wherein the insulation layer includes a covering portion that continuously covers an entire peripheral portion of the top surface of the wiring pattern, and the insulation layer includes another surface that is located upward from the top surface of the wiring pattern.

2. The wiring substrate according to claim 1, wherein the covering portion includes a side surface that is curved and outwardly bulged.

3. The wiring substrate according to claim 1, wherein the entire bottom surface of the wiring pattern, the entire side surface of the wiring pattern, and the peripheral portion of the top surface of the wiring pattern contact the insulation layer and are roughened surfaces having a larger surface roughness than an exposed portion of the top surface of the wiring pattern exposed from the insulation layer.

4. The wiring substrate according to claim 1, wherein the another surface of the insulation layer is a roughened surface having a larger surface roughness than an exposed portion of the top surface of the wiring pattern exposed from the insulation layer.

5. The wiring substrate according to claim 1, wherein the wiring pattern includes a connection pad connected to the electrode pad by the circuit pattern, and the insulation layer includes a through hole that partially exposes a lowest surface of the connection pad.

6. The wiring substrate according to claim 5, further comprising:

a surface-processed layer formed on the lowest surface of the connection pad exposed in the through hole; and a second surface-processed layer formed on an uppermost surface of the electrode pad exposed from the insulation layer.

7. A semiconductor device comprising:

the wiring substrate according to claim 1; and the discrete electronic component or IC chip electrically connected to the electrode pad and mounted on the wiring substrate.

\* \* \* \* \*

UNITED STATES PATENT AND TRADEMARK OFFICE
CERTIFICATE OF CORRECTION

PATENT NO. : 9,799,595 B2  
APPLICATION NO. : 15/297782  
DATED : October 24, 2017  
INVENTOR(S) : Hiroshi Tomizawa et al.

Page 1 of 1

It is certified that error appears in the above-identified patent and that said Letters Patent is hereby corrected as shown below:

On the Title Page

Item (54) and in the Specification, Column 1, Line 1 reads "CARELESS" should read --CORELESS--

Signed and Sealed this  
Twentieth Day of February, 2018

Andrei Iancu  
*Director of the United States Patent and Trademark Office*